(12) United States Patent
Miura et al.

(10) Patent No.: US 9,330,953 B2
(45) Date of Patent: May 3, 2016

(54) ELECTROSTATIC CHUCK DEVICE (75) Inventors: Yukio Miura, Tokyo (JP); Shinichi Maeta, Tokyo (JP); Takashi Satou, Tokyo (JP); Kei Furuuchi, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 167 days.

(21) Appl. No.: 14/005,880

(22) PCT Filed: Mar. 23, 2012

(86) PCT No.: PCT/JP2012/057483
§ 371 (c)(1),
(2), (4) Date: Sep. 18, 2013

(87) PCT Pub. No.: WO2012/128348
PCT Pub. Date: Sep. 27, 2012

(65) Prior Publication Data
US 2014/0008880 A1    Jan. 9, 2014

(30) Foreign Application Priority Data

Mar. 23, 2011 (JP) ................ P2011-064311

(51) Int. Cl.
*H05B 3/68* (2006.01)
*C23C 16/00* (2006.01)
(Continued)

(52) U.S. Cl.
CPC ........ *H01L 21/6833* (2013.01); *H01L 21/6831* (2013.01); *H01L 21/67109* (2013.01); *Y10T 279/23* (2015.01)

(58) Field of Classification Search
CPC .................... H01L 21/67109; H01L 21/6831; H01L 21/6833; Y10T 279/23

USPC ............... 219/444.1, 542–553; 118/724, 725
See application file for complete search history.

(56) References Cited

U.S. PATENT DOCUMENTS

| 4,518,244 A | * | 5/1985 | Kageyama et al. | ............. 492/53 |
| 5,089,856 A | * | 2/1992 | Landa et al. | ................. 399/308 |

(Continued)

FOREIGN PATENT DOCUMENTS

| JP | 2000-100916 A | 4/2000 |
| JP | 2003238922 A | 8/2003 |

(Continued)

OTHER PUBLICATIONS

International Search Report issued in International Patent Application No. PCT/JP2012/057483; Jun. 19, 2012; 4 pages.

(Continued)

*Primary Examiner* — Sang Y Paik
(74) *Attorney, Agent, or Firm* — Wood, Herron & Evans, LLP (57) ABSTRACT

An electrostatic chuck device (1) according to the invention includes an electrostatic chuck section (2) that has a principal surface as a placement surface on which a plate-shaped sample is placed, and is made to have an internal electrode for electrostatic adsorption built-in, and a cooling plate section (3) that cools the electrostatic chuck section (2), wherein a heating member (5) is bonded to a principal surface on the opposite side to the placement surface of the electrostatic chuck section (2) through a first adhesive material layer (4), and the electrostatic chuck section (2) and the heating member (5) are bonded to and integrated with the cooling plate section (3) through an acrylic adhesive layer (9) having flexibility and insulation properties.

5 Claims, 1 Drawing Sheet (51) Int. Cl.
  *H01L 21/683* (2006.01)
  *H01L 21/67* (2006.01)

(56) References Cited

U.S. PATENT DOCUMENTS

| | | | |
|---|---|---|---|
| 5,276,084 A * | 1/1994 | Cheng et al. | 524/555 |
| 6,256,187 B1 * | 7/2001 | Matsunaga et al. | 361/234 |
| 2003/0185480 A1 * | 10/2003 | Chen et al. | 385/1 |
| 2011/0092072 A1 * | 4/2011 | Singh et al. | 438/710 |

FOREIGN PATENT DOCUMENTS

| | | |
|---|---|---|
| JP | 2008-085329 A | 4/2008 |
| JP | 2008-522446 A | 6/2008 |
| JP | 2008527694 A | 7/2008 |
| JP | 2008-300491 A | 12/2008 |
| JP | 2009071023 A | 4/2009 |
| JP | 2009-290071 A | 12/2009 |
| JP | 2010-040644 A | 2/2010 |
| JP | 2011-049425 A | 3/2011 |
| WO | 2011/093451 A1 | 8/2011 |

OTHER PUBLICATIONS

Japanese Patent Office, Notice of Reasons for Rejection issued in corresponding Japanese Patent Application No. 2013-506014 and English-language translation, mailed Feb. 16, 2016.

\* cited by examiner

ELECTROSTATIC CHUCK DEVICE

TECHNICAL FIELD

The present invention relates to an electrostatic chuck device. More specifically, the present invention relates to an electrostatic chuck device which is suitably used when adsorbing and fixing a plate-shaped sample such as a semiconductor wafer by an electrostatic force in etching treatment such as plasma etching in a semiconductor manufacturing process and in which there is no concern of corrosion by a gas used.

Priority is claimed based on Japanese Patent Application No. 2011-064311 filed on Mar. 23, 2011, the contents of which are incorporated herein by reference.

BACKGROUND ART

In recent years, in a semiconductor manufacturing process, further improvement in fine processing technology has been required according to higher integration or higher performance of an element. In the semiconductor manufacturing process, an etching technology is the important one of fine processing technologies, and in recent years, among etching technologies, a plasma etching technology which has high efficiency and in which fine processing of a large area is possible has become mainstream.

The plasma etching technology is one type of dry etching technology. In the plasma etching technology, a mask pattern is formed on a solid material that is a workpiece by using a resist, the solid material is supported in a vacuum, a reactive gas is introduced into the vacuum in this state, a plasma state that is made by collision of electrons accelerated by applying a high-frequency electric field to the reactive gas with gas molecules is generated, and radicals (free radicals) and ions that are generated from the plasma react with the solid material, whereby the solid material is removed as a reaction product. Due to such a process, the plasma etching technology forms a fine pattern in the solid material.

In the past, in a semiconductor manufacturing device using plasma, such as a plasma etching device, an electrostatic chuck device has been used as a device to easily mount and fix a wafer onto a sample stage and maintain the wafer at a desired temperature.

Incidentally, in an existing plasma etching technology, if a wafer fixed to an electrostatic chuck device is irradiated with plasma, the surface temperature of the wafer rises. In order to suppress a rise in the surface temperature, the wafer is cooled from the underside by circulating a cooling medium such as water to a cooling plate section of the electrostatic chuck device. At this time, temperature distribution occurs in the plane of the wafer. For example, at a central portion of the wafer, the temperature becomes high, and at a marginal portion, the temperature becomes low. Further, due to a difference or the like of a structure or a system of the plasma etching device, a difference occurs in in-plane temperature distribution of the wafer.

Therefore, an electrostatic chuck device with a heater function has been proposed in which a heater member is mounted between an electrostatic chuck section and a cooling plate section (refer to PTL 1, for example). In the electrostatic chuck device with a heater function, since it is possible to locally make temperature distribution in a wafer, by setting temperature to match the in-plane temperature distribution of the wafer with a film deposition rate or a plasma etching rate, it is possible to efficiently perform local film formation or local plasma etching such as pattern formation on the wafer.

As a method of mounting a heater on the electrostatic chuck section, there is a method of incorporating a heater into an electrostatic chuck section made of ceramic; a method of applying a heater material to the back side of an adsorption surface of an electrostatic chuck section, that is, the rear surface of a ceramic plate-shaped body in a predetermined pattern by a screen printing method and heating and curing the heater material; a method of sticking metal foil or a sheet-shaped conductive material to the rear surface of the ceramic plate-shaped body, or the like. An electrostatic chuck device with a heater function is obtained by bonding and integrating the heater built-in electrostatic chuck section or an electrostatic chuck section with a heater mounted thereon and a cooling plate section that cools the electrostatic chuck section through an organic adhesive layer.

CITATION LIST

Patent Literature

[PTL 1]
Japanese Unexamined Patent Application Publication No. 2008-300491

SUMMARY OF INVENTION

Technical Problem

Incidentally, in the existing electrostatic chuck device described above, as an organic adhesive that bonds and integrates the electrostatic chuck section and the cooling plate section, a silicone-based adhesive is used. In a case where an attempt to apply the electrostatic chuck device to etching of a polycrystalline silicon (polysilicon) thin film is made, there is a problem in that the silicone-based adhesive reacts with a gas that is used in the etching.

Therefore, use of an acrylic adhesive instead of the silicone-based adhesive has been considered. However, in an existing acrylic adhesive, there is a problem in that a Shore hardness is D70 or more, thereby being hard, and it is difficult to relieve stress between the electrostatic chuck section and the cooling plate section. In addition, in the existing acrylic adhesive, a problem arises in that shrinkage during curing is large and voids are generated in the obtained acrylic adhesive layer due to the curing shrinkage, thereby reducing the insulation properties of the acrylic adhesive layer.

The present invention has been made in view of the above-described circumstances and has an object to provide an electrostatic chuck device in which it is possible to relieve stress between an electrostatic chuck section and a cooling plate section, and even if there is curing shrinkage, there is no concern that voids may be generated in an adhesive layer, and thus there is also no concern that the insulation properties of the adhesive layer may be reduced.

Solution to Problem

The inventors of the present invention have performed intensive studies in order to solve the above-described problems and as a result, have found that if an electrostatic chuck section and a heating member bonded thereto are bonded to and integrated with a cooling plate section through an acrylic adhesive layer having flexibility and insulation properties, it is possible to relieve stress between the electrostatic chuck section and the cooling plate section, and even if there is curing shrinkage, there is no concern that voids may be generated in an adhesive layer, and thus there is also no concern that the insulation properties of the adhesive layer may be reduced, and have led to the completion of the invention.

That is, according to an aspect of the invention, there is provided an electrostatic chuck device including: an electrostatic chuck section that has a principal surface as a placement surface on which a plate-shaped sample is placed, and is made to have an internal electrode for electrostatic adsorption built-in; and a cooling plate section that cools the electrostatic chuck section, in which a heating member is bonded to a principal surface on the opposite side to the placement surface of the electrostatic chuck section through a first adhesive material layer, and the electrostatic chuck section and the heating member are bonded to and integrated with the cooling plate section through an acrylic adhesive layer having flexibility and insulation properties.

In the electrostatic chuck device, the electrostatic chuck section and the heating member bonded to the principal surface on the opposite side to the placement surface of the electrostatic chuck section are bonded to and integrated with the cooling plate section through the acrylic adhesive layer having flexibility and insulation properties. The acrylic adhesive layer becomes a flexible layer, whereby the flexible layer relieves stress and a difference in thermal expansion between the electrostatic chuck section and the heating member, and the cooling plate section.

In the electrostatic chuck device according to the above aspect of the invention, it is preferable that the acrylic adhesive layer be made to contain vinyl acetate or vinyl butyrate in a range of 1% by volume or more and 50% by volume or less.

In the electrostatic chuck device, since the acrylic adhesive layer contains vinyl acetate or vinyl butyrate in a range of 1% by volume or more and 50% by volume or less, is given without reducing a plasma resistance property. Further, curing shrinkage of the acrylic adhesive layer is suppressed compared to an acrylic monomer simple substance, whereby stress between the electrostatic chuck section and the heating member, and the cooling plate section is further relieved.

In the electrostatic chuck device according to the above aspect of the invention, it is preferable that the thickness of the acrylic adhesive layer be set to be 250 µm or less, the Young's modulus of a spacer that is provided between the heating member and the cooling plate section be set to be in a range of 5 MPa or more and 5 GPa or less, and a difference in thermal expansion between the spacer and the acrylic adhesive layer be set to be ±200% or less.

In the electrostatic chuck device, since the thickness of the acrylic adhesive layer is set to be 250 µm or less and the Young's modulus of the spacer that is provided between the heating member and the cooling plate section is set to be in a range of 5 MPa or more and 5 GPa or less, the acrylic adhesive layer prevents stress concentration on the spacer due to curing shrinkage of the acrylic adhesive layer. Further, since a difference in thermal expansion between the spacer and the acrylic adhesive layer is set to be ±200% or less, occurrence of stress in the spacer due to repetitive thermal stress is avoided.

In the electrostatic chuck device according to the above aspect of the invention, it is preferable that the Shore hardness of the acrylic adhesive layer be D40 or less.

In the electrostatic chuck device, since the Shore hardness of the acrylic adhesive layer is set to be D40 or less, stress and a difference in thermal expansion between the electrostatic chuck section and the heating member, and the cooling plate section are further relieved.

In the electrostatic chuck device according to the above aspect of the invention, it is preferable that a terminal for applying voltage that applies voltage to the internal electrode for electrostatic adsorption be connected to the internal electrode for electrostatic adsorption, an insulator be provided so as to surround the terminal for applying voltage, and the thickness of the acrylic adhesive layer between the insulator and the electrostatic chuck section be set to be in a range of 50 µm or more and 150 µm or less.

In the electrostatic chuck device, since the insulator is provided so as to surround the terminal for applying voltage that applies voltage to the internal electrode for electrostatic adsorption and a thickness of the acrylic adhesive layer between the insulator and the electrostatic chuck section is set to be in a range of 50 µm or more and 150 µm or less, insulation properties between the insulator and the electrostatic chuck section is sufficiently secured.

In the electrostatic chuck device according to the above aspect of the invention, it is preferable that an insulating material layer be provided on a principal surface on the electrostatic chuck section side of the cooling plate section with a second adhesive material layer interposed therebetween, and the insulating material layer be bonded to and integrated with the electrostatic chuck section through the acrylic adhesive layer.

In the electrostatic chuck device, since the insulating material layer is bonded to and integrated with the electrostatic chuck section through the acrylic adhesive layer, the insulating material layer maintains good insulation between the electrostatic chuck section and the cooling plate section, thereby preventing a dielectric breakdown. In this way, a voltage resistance property between the electrostatic chuck section and the cooling plate section is improved.

Advantageous Effects of Invention

According to the electrostatic chuck device related to the invention, since the electrostatic chuck section and the heating member are bonded to and integrated with the cooling plate section through the acrylic adhesive layer having flexibility and insulation properties, stress and a difference in thermal expansion between the electrostatic chuck section and the heating member, and the cooling plate section can be relieved due to the acrylic adhesive layer.

Further, in a case where the acrylic adhesive layer contains vinyl acetate or vinyl butyrate in a range of 1% by volume or more and 50% by volume or less, it is possible to improve corrosion resistance to fluorine radicals. Since the acrylic adhesive layer has excellent flexibility, stress between the electrostatic chuck section and the heating member, and the cooling plate section can be further relieved due to the acrylic adhesive layer.

Further, in a case where the thickness of the acrylic adhesive layer is set to be 250 µm or less, the Young's modulus of the spacer that is provided between the heating member and the cooling plate section is set to be in a range of 5 MPa or more and 5 GPa or less, and a difference in thermal expansion between the spacer and the acrylic adhesive layer is set to be ±200% or less, stress concentration on the spacer due to curing shrinkage of the acrylic adhesive layer can be relieved due to the acrylic adhesive layer, and thus it is possible to reduce occurrence of voids in the vicinity of the spacer and peeling-off of the adhesive layer. Therefore, stress and a difference in thermal expansion between the electrostatic chuck section and the heating member, and the cooling plate section can be further relieved due to the acrylic adhesive layer.

Further, in a case where the thickness of the acrylic adhesive layer between the electrostatic chuck section and the insulator provided so as to surround the terminal for applying voltage that applies voltage to the internal electrode for electrostatic adsorption is set to be in a range of 50 μm or more and 150 μm or less, it is possible to sufficiently secure insulation properties between the insulator and the electrostatic chuck section.

In addition, in a case where the insulating material layer is bonded to and integrated with the electrostatic chuck section through the acrylic adhesive layer, good insulation between the electrostatic chuck section and the cooling plate section can be maintained due to the insulating material layer, and thus it is possible to prevent a dielectric breakdown. Therefore, it is possible to improve a voltage resistance property between the electrostatic chuck section and the cooling plate section.

DESCRIPTION OF EMBODIMENTS

An embodiment for carrying out an electrostatic chuck device according to the invention will be described based on the drawing. In addition, this mode is intended to be specifically described for better understanding of the gist of the invention and is not intended to limit the invention unless otherwise specified.

Figure 1:
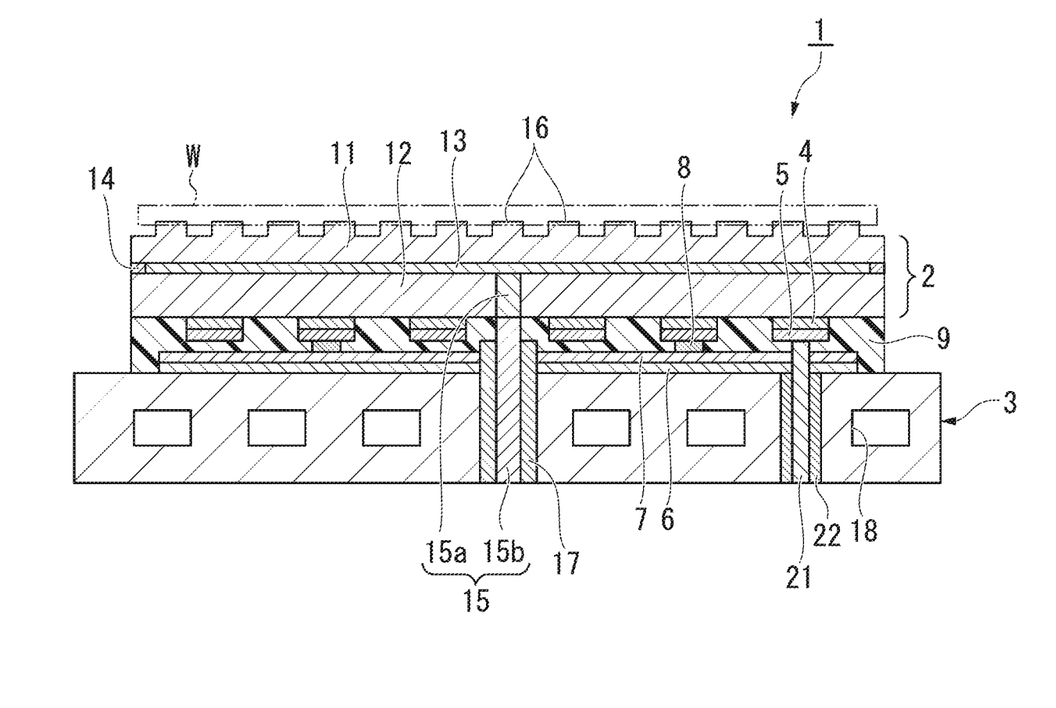
FIG. 1 is a cross-sectional view showing an electrostatic chuck device according to an embodiment of the invention.

FIG. 1 is a cross-sectional view showing an electrostatic chuck device according to an embodiment of the invention, and an electrostatic chuck device 1 is configured to include a disk-shaped electrostatic chuck section 2, a disk-shaped cooling plate section 3 with a thickness, which cools the electrostatic chuck section 2 to a desired temperature, a first adhesive material layer 4 having a predetermined pattern and bonded to the lower surface of the electrostatic chuck section 2, heater elements (a heating member) 5 bonded to the lower surface of the first adhesive material layer 4 and having a pattern of the same shape as the first adhesive material layer 4, an insulating member 7 bonded to the upper surface of the cooling plate section 3 through a second adhesive material layer 6, a spacer 8 which is provided between the heater elements 5 and the insulating member 7, and an acrylic adhesive layer 9 which has flexibility and insulation properties and bonds and integrates the heater elements 5 on the lower surface of the electrostatic chuck section 2 and the insulating member 7 on the cooling plate section 3 in a state where the heater elements 5 and the insulating member 7 face each other.

The electrostatic chuck section 2 is configured to include a placement plate 11, the upper surface of which is a placement surface on which a plate-shaped sample W such as a semiconductor wafer is placed, a support plate 12 which is integrated with the placement plate 11 and supports the placement plate 11, an internal electrode for electrostatic adsorption 13 provided between the placement plate 11 and the support plate 12, an insulating material layer 14 which is provided around the internal electrode for electrostatic adsorption 13 and isolates the internal electrode for electrostatic adsorption 13, and a terminal for applying voltage 15 which is provided so as to pass through the support plate 12 and applies direct-current voltage to the internal electrode for electrostatic adsorption 13, A projection portion 16 having a diameter smaller than the thickness of the plate-shaped sample is formed in plural on the placement surface of the placement plate 11, and the projection portions 16 support the plate-shaped sample W.

The placement plate 11 and the support plate 12 are of a disk shape and the shapes of the surfaces at which the two are superimposed on one another are the same. Each of the placement plate 11 and the support plate 12 is formed of an insulating ceramic sintered body having mechanical strength and resistance to a corrosive gas and plasma thereof, such as an aluminum oxide-silicon carbide ($Al_2O_3$—$SiO$) composite sintered body, an aluminum oxide ($Al_2O_3$) sintered body, or an aluminum nitride (AlN) sintered body.

The internal electrode for electrostatic adsorption 13 is used as an electrode for an electrostatic chuck for generating electric charges, thereby fixing the plate-shaped sample W by an electrostatic adsorption force. The shape or the size of the internal electrode for electrostatic adsorption 13 is appropriately adjusted depending on the use thereof. The internal electrode for electrostatic adsorption 13 is formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN-W) conductive composite sintered body, or an aluminum nitride-tantalum (AlN—Ta) conductive composite sintered body, or high melting point metal such as tungsten (W), tantalum (Ta), molybdenum (Mo), or titanium (Ti).

The thickness of the internal electrode for electrostatic adsorption 13 is not particularly limited. However, the thickness in a range of 0.1 μm or more and 100 μm or less is preferable, and the thickness in a range of 5 μm or more and 20 μm or less is particularly preferable. If the thickness is less than 0.1 μm, area resistance becomes too large, and thus it is not possible to secure sufficient electric conductivity. On the other hand, if the thickness exceeds 100 μm, due to a difference in coefficient of thermal expansion between the internal electrode for electrostatic adsorption 13, and the placement plate 11 and the support plate 12, cracks easily occur in joint interfaces between the internal electrode for electrostatic adsorption 13 and the placement plate 11, and between the internal electrode for electrostatic adsorption 13 and the support plate 12.

The internal electrode for electrostatic adsorption 13 having such a thickness can be easily formed by a film formation method such as a sputtering method or a vapor deposition method, or a coating method such as a screen printing method.

The insulating material layer 14 surrounds the internal electrode for electrostatic adsorption 13, thereby protecting the internal electrode for electrostatic adsorption 13 from a corrosive gas and plasma thereof and also joining and integrating a boundary portion between the placement plate 11 and the support plate 12, that is, an outer peripheral portion area outside the internal electrode for electrostatic adsorption 13. The insulating material layer 14 is configured of an insulating material having the same composition or the same main component as a material that configures the placement plate 11 and the support plate 12.

The terminal for applying voltage 15 has a rod shape and is provided in order to apply direct-current voltage to the internal electrode for electrostatic adsorption 13. The terminal for applying voltage 15 is configured to include a terminal for applying voltage 15a which is fixed into the electrostatic chuck section 2, and a terminal for applying voltage 15b which is joined to and integrated with the terminal for applying voltage 15a, thereby being electrically connected to the terminal for applying voltage 15a, and is also fixed to the cooling plate section 3 and the acrylic adhesive layer 9.

As a material of the terminal for applying voltage 15, it is favorable if it is an electrically-conductive material having excellent heat resistance, and there is no particular limitation. As a material of the terminal for applying voltage 15a, a material having a coefficient of thermal expansion close to the coefficients of thermal expansion of the internal electrode for electrostatic adsorption 13 and the support plate 12 is preferable, and for example, the same composition as or a similar composition to the internal electrode for electrostatic adsorption 13 is suitably used. Specifically, conductive ceramics, or a metal material such as tungsten (W), tantalum (Ta), molybdenum (Mo), niobium (Nb), or a Kovar alloy is suitably used.

On the other hand, as a material of the terminal for applying voltage 15b, a material having a coefficient of thermal expansion close to the coefficients of thermal expansion of the cooling plate section 3 and the acrylic adhesive layer 9, which will be described later, is preferable, and for example, a metal material having the same composition as or a similar composition to the cooling plate section 3 is suitably used. Specifically, aluminum (Al), an aluminum alloy, copper (Cu), a copper alloy, stainless steel (SUS), titanium (Ti), or the like is suitably used.

The terminal for applying voltage 15 is insulated from the cooling plate section 3 by an insulator 17. The terminal for applying voltage 15 is joined to and integrated with the support plate 12, and the placement plate 11 and the support plate 12 are joined to and integrated with each other by the internal electrode for electrostatic adsorption 13 and the insulating material layer 14, whereby the electrostatic chuck section 2 is configured.

It is preferable that the thickness of the electrostatic chuck section 2, that is, the total thickness of the placement plate 11, the support plate 12, the internal electrode for electrostatic adsorption 13, and the insulating material layer 14 be in a range of 0.7 mm or more and 3.0 mm or less. If the thickness of the electrostatic chuck section 2 is less than 0.7 mm, the mechanical strength of the electrostatic chuck section 2 cannot be secured. On the other hand, if the thickness of the electrostatic chuck section 2 exceeds 3.0 mm, the heat capacity of the electrostatic chuck section 2 becomes too large, and as a result, the thermal responsiveness of the plate-shaped sample W which is placed thereon is degraded, and further, due to an increase in heat transfer in a lateral direction of the electrostatic chuck section 2, it becomes difficult to maintain the in-plane temperature of the plate-shaped sample W in a desired temperature pattern.

The cooling plate section 3 is provided on the lower side of the electrostatic chuck section 2 to cool the electrostatic chuck section 2, thereby controlling the placement surface of the placement plate 11 to a desired temperature, and is combined with an electrode for high frequency generation. A flow path 18 which circulates a medium for cooling such as water or an organic solvent is formed in the cooling plate section 3, whereby the temperature of the plate-shaped sample W which is placed on the placement plate 11 can be maintained at a desired temperature.

As a material configuring the cooling plate section 3, if it is metal having excellent thermal conductivity, electric conductivity, and workability, or a composite material that includes the metal, there is no particular limitation, and for example, aluminum (Al), an aluminum alloy, copper (Cu), a copper alloy, stainless steel (SUS), or the like is suitably used. It is preferable that at least the surface that is exposed to plasma, of the cooling plate section 3, be subjected to alumite treatment or an insulating film such as alumina be formed thereon.

The first adhesive material layer 4 is of a sheet shape or a film shape and has the same pattern shape as the heater elements 5. As a material of the first adhesive material layer 4, it is favorable if it is a material capable of bonding the heater elements 5 to the lower surface of the support plate 12, and adhesive resin having heat resistance and insulation properties, for example, polyimide resin, silicone resin, epoxy resin, acrylic resin, or the like can be given.

It is preferable that the thickness of the first adhesive material layer 4 be in a range of 5 µm to 100 µm, and the thickness in a range of 10 µm to 50 µm is more preferable. It is preferable that variation in the in-plane thickness of the first adhesive material layer 4 be within 10 µm. If variation in the in-plane thickness of the first adhesive material layer 4 exceeds 10 µm, variation exceeding 10 µm occurs in the in-plane distance between the electrostatic chuck section 2 and the heater elements 5. As a result, the in-plane uniformity of heat that is transmitted from the heater elements 5 to the electrostatic chuck section 2 is reduced, and thus the in-plane temperature in the placement surface of the electrostatic chuck section 2 becomes non-uniform. As a result, since the uniformity of the in-plane temperature of the plate-shaped sample W is reduced, it is not preferable.

The heater elements 5 are disposed on the lower surface of the support plate 12 with the first adhesive material layer 4 interposed therebetween and have a pattern in which a strip-shaped metal material having a narrow width is meandered. Terminals for applying voltage 21 are connected to both end portions of the heater elements 5, and the terminal for applying voltage 21 is insulated from the cooling plate section 3 by an insulator 22. In the heater elements 5, in-plane temperature distribution of the plate-shaped sample W fixed onto the projection portions 16 of the placement plate 11 by electrostatic adsorption is accurately controlled by controlling applied voltage.

It is preferable that the heater elements 5 have a constant thickness of 0.2 mm or less, preferably, 0.1 mm or less. As a material of the heater elements 5, a nonmagnetic metal thin plate, for example, a titanium (Ti) thin plate, a tungsten (W) thin plate, a molybdenum (Mo) thin plate, or the like is preferable. The heater elements 5 are formed by etching such a material to a desired heater pattern by a photolithographic method.

If the thickness of the heater elements 5 exceeds 0.2 mm, the pattern shape of the heater elements 5 is reflected as the temperature distribution of the plate-shaped sample W, and thus it becomes difficult to maintain the in-plane temperature of the plate-shaped sample W in a desired temperature pattern.

Further, even if the electrostatic chuck device 1 is used in a high-frequency atmosphere, the heater elements do not perform self-heating by a high frequency as long as the heater elements 5 are formed of nonmagnetic metal. Therefore, it preferably becomes easy to maintain the in-plane temperature of the plate-shaped sample W at a desired constant temperature or in a constant temperature pattern.

Further, if the heater elements 5 are formed using a nonmagnetic metal this plate having a constant thickness, the thickness of the heater element 5 becomes constant in the entire heating surface and a caloric value also becomes constant in the entire heating surface, and therefore, it is possible to uniformize the temperature distribution in the placement surface of the electrostatic chuck section 2.

The second adhesive material layer 6 is for bonding and fixing the insulating member 7 to the upper surface of the cooling plate section 3 and is formed of a sheet-shaped or film-shaped adhesive resin having heat resistance and insulation properties, similar to the first adhesive material layer 4. As the adhesive resin, for example, acrylic resin, polyimide resin, silicone resin, epoxy resin, or the like can be given. In particular, considering application to an etching device that etches a polycrystalline silicon (polysilicon) thin film, acrylic resin is preferable.

It is preferable that the thickness of the second adhesive material layer 6 be in a range of 10 μm to 100 μm, and the thickness in a range of 25 μm to 50 μm is more preferable. It is preferable that variation in the in-plane thickness of the second adhesive material layer 6 be within 10 μm. If variation in the in-plane thickness of the second adhesive material layer 6 exceeds 10 μm, variation exceeding 10 μm occurs in the distance between the cooling plate section 3 and the insulating member 7. As a result, the in-plane uniformity of temperature control of the electrostatic chuck section 2 by the cooling plate section 3 is reduced, and thus the in-plane temperature in the placement surface of the electrostatic chuck section 2 becomes non-uniform. As a result, since the uniformity of the in-plane temperature of the plate-shaped sample W is reduced, it is not preferable.

The insulating member 7 is formed of a sheet-shaped or film-shaped resin having heat resistance and insulation properties. As the insulating resin, for example, acrylic resin, polyimide resin, silicone resin, epoxy resin, or the like can be given. In particular, considering application to an etching device that etches a polycrystalline silicon (polysilicon) thin film, acrylic resin is preferable.

It is preferable that variation in the in-plane thickness of the insulating member 7 be within 10 μm. If variation in the in-plane thickness of the insulating member 7 exceeds 10 μm, a difference in height occurs in temperature distribution according to the size of the thickness, and as a result, since temperature control by thickness adjustment of the insulating member 7 is adversely affected, it is not preferable.

It is preferable that the thermal conductivity of the insulating member 7 be in a range of 0.05 W/mk or more and 0.5 W/mk or less, and the thermal conductivity in a range of 0.1 W/mk or more and 0.25 W/mk or less is more preferable. If the thermal conductivity is less than 0.1 W/mk, since heat transfer through the insulating member 7 from the electrostatic chuck section 2 to the cooling plate section 3 becomes difficult, and thus a cooling rate is reduced, it is not preferable. On the other hand, if the thermal conductivity exceeds 1 W/mk, since heat transfer through the insulating member 7 from the heater elements 5 to the cooling plate section 3 increases and a rate of temperature rise is reduced, it is not preferable.

The spacer 8 is provided between the heater elements 5 and the insulating member 7, thereby maintaining the distance between the heater elements 5 and the insulating member 7 at a predetermined distance. Due to the spacer 8, it is possible to maintain the distance between the heater elements 5 and the insulating member 7, that is, the distance between the electrostatic chuck section 2 and the cooling plate section 3 at a predetermined distance.

It is preferable that the Young's modulus of the spacer 8 be in a range of 5 MPa or more and 5 GPa or less, and the Young's modulus in a range of 50 MPa or more and 3 GPa or less is more preferable. When the Young's modulus of the spacer 8 is less than 5 MPa, since deformation due to load at the time of adhesion is large, and thus it becomes not possible to maintain an adhesive layer at a predetermined thickness, it is not preferable. On the other hand, if the Young's modulus exceeds 5 GPa, since when forming the acrylic adhesive layer 9, at the time of curing shrinkage of an acrylic adhesive, stress at the time of the curing shrinkage is concentrated on the spacer 8, and thus occurrence of voids and peeling-off of the adhesive layer occur, it is not preferable.

The acrylic adhesive layer 9 is an adhesive layer having flexibility and insulation properties and bonds and integrates the electrostatic chuck section 2 and the heater elements 5, and the cooling plate section 3 and the insulating member 7 in a state of facing each other.

It is preferable that the thickness of the acrylic adhesive layer 9 be 250 μm or less, and the thickness of 200 μm or less is more preferable. If the thickness of the acrylic adhesive layer 9 exceeds 250 μm, a change in thickness due to curing shrinkage of an acrylic adhesive becomes too large, and thus voids due to curing shrinkage are generated in the obtained acrylic adhesive layer 9, and further, there is a concern that a crack, fracture, or the like may occur. As a result, there is a concern that the insulation properties of the acrylic adhesive layer 9 may be reduced.

It is preferable that the Shore hardness of the acrylic adhesive layer 9 be D40 or less, and the Shore hardness of D25 or less is more preferable. If the Shore hardness of the acrylic adhesive layer 9 exceeds D40, the acrylic adhesive layer 9 becomes too hard, and thus it becomes difficult to relieve stress between the electrostatic chuck section 2 and the cooling plate section 3. It is preferable that the lower limit of the Shore hardness be D5, and it is more preferable that the lower limit be D10. If the Shore hardness of the acrylic adhesive layer 9 is less than D5, variation occurs in the thickness of the adhesive layer, and thus the uniformity of the in-plane temperature distribution of the placement surface is reduced.

As an acrylic adhesive configuring the acrylic adhesive layer 9, acrylic acid and an ester thereof, methacrylic acid and an ester thereof, acrylamide, acrylonitrile, and polymers or copolymers thereof can be given. Among them, in particular, a polyacrylic acid ester such as polyacrylic acid methyl, a polymethacrylic acid ester such as polymethacrylic acid methyl, or the like is suitable used.

It is preferable that the acrylic adhesive be made to contain vinyl acetate or vinyl butyrate in a range of 1% by volume or more and 50% by volume or less, preferably, 10% by volume or more and 40% by volume or less, further preferably, 20% by volume or more and 30% by volume or less. In this acrylic adhesive, vinyl acetate or vinyl butyrate is contained in a range of 1% by volume or more and 50% by volume or less, whereby corrosion resistance to fluorine radicals of the acrylic adhesive is improved. Further, vinyl acetate or vinyl butyrate is contained in a range of 1% by volume or more and 50% by volume or less, whereby the flexibility of the acrylic adhesive is improved, and as a result, stress between the electrostatic chuck section 2 and the heater elements 5, and the cooling plate section 3 is further relieved.

It is preferable that the thickness of an area that is sandwiched between the electrostatic chuck section 2 and the insulator 17, of the acrylic adhesive layer 9, be in a range of 50 μm or more and 150 μm or less, it is more preferable that the thickness of the area be in a range of 70 m or more and 120 μm or less, and it is further preferable that the thickness of the area be in a range of 80 μm or more and 120 μm or less. If the thickness of the area is set to be in a range of 50 μm or more and 150 μm or less, it is possible to sufficiently secure insulation properties between the electrostatic chuck section 2 and the insulator 17. If the thickness of the area is less than 50 μm, since insulation properties between the electrostatic chuck section 2 and the insulator 17 becomes insufficient, it is not preferable. On the other hand, if the thickness exceeds 150 although insulation properties between the electrostatic chuck section 2 and the insulator 17 is secured, since the overall thickness of the adhesive layer becomes thick and damage to a cooling characteristic and an outer peripheral portion of the adhesive layer due to plasma increases, it is not preferable.

Next, a method of manufacturing the electrostatic chuck device 1 will be described.

First, the plate-shaped placement plate 11 and the plate-shaped support plate 12 are made of an aluminum oxide-silicon carbide ($Al_2O_3$—SiO) composite sintered body. In this case, the placement plate 11 and the support plate 12 can be obtained by molding a powder mix that includes silicon carbide powder and aluminum oxide powder into a desired shape and then performing firing for a predetermined time at a temperature in a range of 1600° C. to 2000° C., for example, and in a non-oxidizing atmosphere, preferably, an inert atmosphere.

Subsequently, a plurality of fixing holes for fitting and holding the terminal for applying voltage 15a is formed in the support plate 12.

Subsequently, the terminal for applying voltage 15a is made so as to have a size and a shape which can be closely fixed to the fixing hole of the support plate 12. In a case where a conductive composite sintered body is used as the terminal for applying voltage 15a, as a method of making the terminal for applying voltage 15a, a method of molding conductive ceramic powder into a desired shape and then performing pressurized firing, or the like can be given. As the conductive ceramic powder, the same material as the internal electrode for electrostatic adsorption 13 is preferable. Further, in a case where metal is used as the terminal for applying voltage 15a, as a method of making the terminal for applying voltage 15a, a method of shaping high melting point metal by a grinding method, a metal processing method such as powder metallurgy, or the like can be given.

Subsequently, a layer of forming an internal electrode for electrostatic adsorption is formed by applying an application liquid for formation of an internal electrode for electrostatic adsorption in which a conducting material such as the above-described conductive ceramic powder is dispersed in an organic solvent, onto a predetermined area of the surface of the support plate 12 with the terminal for applying voltage 15a fitted therein, so as to come into contact with the terminal for applying voltage 15a, and performing drying. As the application method, in terms of being capable of applying application liquid to a uniform thickness, a screen printing method, a spin coating method, or the like is preferable. Further, as another method, there is a method of forming a thin film made of the above-described high melting point metal by a vapor deposition method or a sputtering method, a method of disposing a thin plate made of the above-described conductive ceramics or high melting point metal, thereby making the thin plate a layer of forming an internal electrode for electrostatic adsorption, or the like.

Further, the insulating material layer 14 that includes a powder material having the same composition or the same main component as the placement plate 11 and the support plate 12 is formed on an area the support plate 12, on which the layer of forming an internal electrode for electrostatic adsorption is not formed, in order to improve insulation properties, corrosion resistance, and a plasma resistance property. The insulating material layer 14 can be formed, for example, by applying an application liquid in which insulating material powder having the same composition as the placement plate 11 and the support plate 12 or insulating material powder having the same main component as the placement plate 11 and the support plate 12 is dispersed in an organic solvent, onto the predetermined area by screen printing or the like and performing drying.

Subsequently, the placement plate 11 is superimposed on the layer of forming an internal electrode for electrostatic adsorption and the insulating material layer 14 on the support plate 12 and is then integrated therewith by hot pressing at a high temperature and high pressure. It is preferable that the atmosphere in the hot pressing be a vacuum or an inert atmosphere such as Ar, He, or $N_2$. Further, it is preferable that the pressure be in a range of 5 MPa to 10 MPa, and it is preferable that the temperature be in a range of 1600° C. to 1850° C.

Due to the hot pressing, the layer of forming an internal electrode for electrostatic adsorption is fired, thereby being turned into the internal electrode for electrostatic adsorption 13 made of a conductive composite sintered body. At the same time, the support plate 12 and the placement plate 11 are joined and integrated with each other with the insulating material layer 14 interposed therebetween. Further, the terminal for applying voltage 15a is re-fired by hot pressing at a high temperature and high pressure, thereby being closely fixed to the fixing hole of the support plate 12. The upper and lower surfaces, the outer periphery, a gas hole, and the like of the joined body are machined, whereby the electrostatic chuck section 2 is obtained.

Subsequently, adhesive resin having heat resistance and insulation properties, such as acrylic resin, is stuck to a pre-determined area of the surface (the lower surface) of the support plate 12 of the electrostatic chuck section 2 so as to form the first adhesive material layer 4. As adhesive resin of the first adhesive material layer 4, resin being of a sheet shape or a film shape and having the same pattern shape as the heater elements 5 is used. The first adhesive material layer 4 can also be made by sticking an adhesive resin sheet or an adhesive resin film having heat resistance and insulation properties, such as acrylic resin, to the surface (the lower surface) of the support plate 12 and forming the same pattern as the heater elements 5 in the sheet or the film.

Subsequently, a nonmagnetic metal thin plate such as a titanium (Ti) thin plate, a tungsten (W) thin plate, or a molybdenum (Mo) thin plate, for example, is stuck onto the first adhesive material layer 4, and the nonmagnetic metal thin plate is etched into a desired heater pattern by a photolithographic method, thereby forming the heater elements 5. In this way, an electrostatic chuck section with heater elements is obtained in which the heater elements 5 having a desired heater pattern are formed on the surface (the lower surface) of the support plate 12 with the first adhesive material layer 4 interposed therebetween.

Subsequently, the terminal for applying voltage 21 having a predetermined size and shape is made. It is preferable that a material of the terminal for applying voltage 21 be a material of the same quality as that of the heater elements 5, and the terminal for applying voltage 21 and the heater elements 5 are electrically connected to each other. As a connection method, a method by a screw or welding can be given.

On the other hand, machining is performed on a metal material made of aluminum (Al), an aluminum alloy, copper (Cu), a copper alloy, stainless steel (SUS), or the like, and a flow path or the like that circulates water is formed in the inside of the metal material, as necessary. In addition, a fixing hole for fitting and holding the terminal for applying voltage 15b and the insulator 17 and a fixing hole for fitting and holding the terminal for applying voltage 21 and the insulator 22 are formed in the metal material, whereby the cooling plate section 3 is obtained. It is preferable that on at least the surface that is exposed to plasma, of the cooling plate section 3, alumite treatment be performed or an insulating film such as alumina be formed.

Subsequently, the joint surface to the electrostatic chuck section 2, of the cooling plate section 3, is degreased and cleaned by using, for example, acetone, and a sheet-shaped or film-shaped adhesive resin having heat resistance and insulation properties, such as acrylic resin, polyimide resin, silicone resin, or epoxy resin, is stuck to a predetermined position on the joint surface, thereby forming the second adhesive material layer 6.

Subsequently, resin having insulation properties and a voltage resistance property, such as acrylic resin, polyimide resin, silicone resin, or epoxy resin, is stuck onto the second adhesive material layer 6, thereby forming the insulating member 7. As resin of the insulating member 7, a resin being of a sheet shape or a film shape and having the same planar shape as the second adhesive material layer 6 is used.

Subsequently, an acrylic adhesive is applied to a predetermined area on the cooling plate section 3 with the second adhesive material layer 6 and the insulating member 7 stacked thereon. The acrylic adhesive is obtained, for example, by adding vinyl acetate or vinyl butyrate in a range of 1% by volume or more and 50% by volume or less into acrylic resin such as polyacrylic acid methyl or polymethacrylic acid methyl. The application quantity of the acrylic adhesive is set to be in the range of a predetermined amount such that the electrostatic chuck section 2 and the cooling plate section 3 are joined and integrated with each other in a state of maintaining a constant distance by the spacer 8 or the like.

As a method of applying the acrylic adhesive, in addition to manual application using a spatula, a bar coating method, a screen printing method, or the like can be given. However, since it is necessary to accurately form an adhesive layer at a predetermined area on the cooling plate section 3, a screen printing method is preferable.

After the application, the electrostatic chuck section 2 and the cooling plate section 3 are superimposed on one another with the acrylic adhesive interposed therebetween. At this time, the terminal for applying voltage 15b and the insulator 17, and the terminal for applying voltage 21 and the insulator 22 are inserted and fitted in accommodation holes for voltage-applying terminal (not shown) perforated in the cooling plate section 3.

Subsequently, depression is performed until the distance between the heater elements 5 on the lower surface of the electrostatic chuck section 2 and the insulating member 7 on the upper surface of the cooling plate section 3 reaches the thickness of the spacer 8, and an extruded extra acrylic adhesive is removed.

By the above, the electrostatic chuck section 2 and the heater elements 5 are joined to and integrated with the cooling plate section 3 and the insulating member 7 with the acrylic adhesive layer 9 interposed therebetween, whereby the electrostatic chuck device 1 of this embodiment is obtained.

In the electrostatic chuck device 1 obtained in this way, since the electrostatic chuck section 2 and the heater elements 5 are bonded to and integrated with the cooling plate section 3 and the insulating member 7 with the acrylic adhesive layer 9 having flexibility and insulation properties interposed therebetween, due to the acrylic adhesive layer 9, it is possible to relieve stress and a difference in thermal expansion between the electrostatic chuck section 2 and the cooling plate section 1

Further, since the acrylic adhesive layer 9 contains vinyl acetate or vinyl butyrate in a range of 1% by volume or more and 50% by volume or less, corrosion resistance to fluorine radicals can be improved. Since the acrylic adhesive layer 9 has excellent flexibility, due to the acrylic adhesive layer 9, it is possible to further relieve stress between the electrostatic chuck section 2 and the heater elements 5, and the cooling plate section 3 and the insulating member 7.

EXAMPLES

Hereinafter, the invention will be specifically described using an example and a comparative example. However, the invention is not limited by the example.

Example (Fabrication of Electrostatic Chuck Device)

The electrostatic chuck section 2 with the internal electrode for electrostatic adsorption 13 having a thickness of 15 μm embedded inside was fabricated by a known method. The placement plate 11 of the electrostatic chuck section 2 was an aluminum oxide-silicon carbide composite sintered body that contains 8% by mass of silicon carbide and had a disk shape having a diameter of 320 mm and a thickness of 4 mm.

Further, the support plate 12 was also an aluminum oxide-silicon carbide composite sintered body that contains 8% by mass of silicon carbide and had a disk shape having a diameter of 320 mm and a thickness of 4 mm, similar to the placement plate 11. By joining and integrating the placement plate 11 and the support plate 12 with each other, the overall thickness of the electrostatic chuck section 2 became 8 mm.

After the joined body has been machined so as to have a diameter of 298 mm and a thickness of 4 mm, the electrostatic adsorption surface of the placement plate 11 was turned into a concave-convex surface by forming a large number of projection portions 16 having a height of 40 μm. Further, the top surfaces of the projection portions 16 were set to be retaining surfaces for the plate-shaped sample W such that a cooling gas can flow through a groove which is formed between a concave portion and the plate-shaped sample W adsorbed electrostatically.

On the other hand, the cooling plate section 3 made of aluminum and having a diameter of 350 mm and a height of 30 mm was fabricated by machining. The flow path 18 that circulates a refrigerant was formed in the inside of the cooling plate section 3. Further, a rectangular spacer having a width of 2 mm, a length of 2 μm, and a height of 75 μm was made of a polyimide sheet.

Subsequently, the surface (the lower surface) of the support plate 12 of the electrostatic chuck section 2 was degreased and cleaned by using acetone, and a sheet adhesive made of acrylic resin having a thickness of 25 μm was stuck to a predetermined area of the surface, thereby forming the first adhesive material layer 4.

Subsequently, a titanium (Ti) thin plate having a thickness of 100 μm was placed on the first adhesive material layer 4. Subsequently, the electrostatic chuck section 2 and the titanium (Ti) thin plate were pressurized and held at 150° C. in a vacuum, thereby being bonded and fixed to each other.

Subsequently, the titanium (Ti) thin plate was etched into a predetermined heater pattern by a photolithographic method, thereby forming the heater elements 5. Further, the terminal for applying voltage 21 made of titanium was provided in an erect manner at the heater elements 5 by using a welding method, and the terminal for applying voltage 15a was fitted in and fixed to a fixing hole of the electrostatic chuck section 2. In this way, an electrostatic chuck section with heater elements was obtained.

Subsequently, the joint surface to the electrostatic chuck section 2, of the cooling plate section 3, was degreased and cleaned by using acetone, a sheet adhesive made of acrylic resin having a thickness of 50 μm as the second adhesive material layer 6 was stuck to a predetermined position on the joint surface, and subsequently, a polyimide film having a thickness of 50 μm as the insulating member 7 was stuck onto the sheet adhesive.

Subsequently, an acrylic adhesive was applied onto the cooling plate section 3 with the sheet adhesive and the polyimide film stacked thereon, by a screen printing method, and subsequently, the electrostatic chuck section 2 and the cooling plate section 3 were superimposed on one another with the acrylic adhesive interposed therebetween.

Subsequently, after depression has been performed until the distance between the heater elements 5 on the lower surface of the electrostatic chuck section 2 and the insulating member 7 on the upper surface of the cooling plate section 3 reaches the thickness of the spacer 8, the joined body was maintained at 110° C. for 5 hours. Thereafter, the acrylic adhesive was cured, thereby joining the electrostatic chuck section 2 and the cooling plate section 3 to each other, and further, the terminal for applying voltage 15b made of titanium was bonded and fixed to the terminal for applying voltage 15a by using a conductive silicon adhesive, whereby an electrostatic chuck device of the example was fabricated. In addition, the Shore hardness of the acrylic adhesive layer 9 was D20.

(Evaluation)

The electrostatic chuck device was installed in a vacuum chamber, and a silicon wafer was disposed on the placement surface in a state where the cooling plate section was kept constant at 20° C. by a fluorocarbon refrigerant. Thereafter, the silicon wafer was intermittently heated by the heater elements 5 in a state where direct-current voltage of 2500 V was applied to the terminal for applying voltage 15. By such a process, a repeated heating test in which the surface temperature of the silicon wafer is repeated between 100° C. and 20° C. was carried out a total of 1000 times.

As a result, by observation using an ultrasonic flaw detection device after heating is repeated 1000 times, it was confirmed that there was no peeling-off or the like in the adhesive layer. Further, a change in flatness before and after heating by three-dimensional measurement was 3 μm, and the electrostatic chuck device had withstand voltage of 4000 V or more between the terminal for applying voltage 15 and the cooling plate section.

Comparative Example (Fabrication of Electrostatic Chuck Device)

An electrostatic chuck device of a comparative example was fabricated according to the example except that the electrostatic chuck section 2 and the cooling plate section 3 were superimposed on one another with a D50 acrylic adhesive interposed therebetween.

(Evaluation)

The electrostatic chuck device was installed in a vacuum chamber, and a silicon wafer was disposed on the placement surface in a state where the cooling plate section was kept constant at 20° C. by a fluorocarbon refrigerant. Thereafter, the silicon wafer was intermittently heated by the heater elements 5 in a state where direct-current voltage of 2500 V was applied to the terminal for applying voltage 15. By such a process, a repeated heating test in which the surface of the silicon wafer is repeatedly heated between 100° C. and 20° C. was carried out a total of 1000 times.

As a result, an electric discharge occurred between the terminal for applying voltage 15 and the cooling plate section 3 at the time of the 120th temperature-fall and an electric power supply was stopped due to an eddy current. After the test, by observation using an ultrasonic flaw detection device, peeling-off of the acrylic adhesive layer was confirmed.

REFERENCE SIGNS LIST

1: electrostatic chuck device
2: electrostatic chuck section
3: cooling plate section
4: first adhesive material layer
5: heater elements
6: second adhesive material layer
7: insulating member
8: spacer
9: acrylic adhesive layer
11: placement plate
12: support plate
13: internal electrode for electrostatic adsorption
14: insulating material layer
15, 15a, 15b: terminal for applying voltage
16: projection portion
17: insulator
21: terminal for applying voltage
22: insulator
W: plate-shaped sample

The invention claimed is:

1. An electrostatic chuck device comprising:
an electrostatic chuck section that has a principal surface as a placement surface on which a plate-shaped sample is placed, and is made to have an internal electrode for electrostatic adsorption built-in; and
a cooling plate section that cools the electrostatic chuck section,
wherein a heating member is bonded to a principal surface on the opposite side to the placement surface of the electrostatic chuck section through a first adhesive material layer,
the electrostatic chuck section and the heating member are bonded to and integrated with the cooling plate section through an acrylic adhesive layer having flexibility and insulation properties, and
a thickness of the acrylic adhesive layer is set to be 250 μm or less, a Young's modulus of a spacer that is provided between the heating member and the cooling plate section is set to be in a range of 5 MPa or more and 5 GPa or less, and a difference in thermal expansion between the spacer and the acrylic adhesive layer is set to be ±200% or less.

2. The electrostatic chuck device according to claim 1, wherein the acrylic adhesive layer is made to contain vinyl acetate or vinyl butyrate in a range of 1% by volume or more and 50% by volume or less.

3. The electrostatic chuck device according to claim 1, wherein a Shore hardness of the acrylic adhesive layer is D40 or less.

4. The electrostatic chuck device according to claim 1, wherein a terminal for applying voltage that applies voltage to the internal electrode for electrostatic adsorption is connected to the internal electrode for electrostatic adsorption, an insulator is provided so as to surround the terminal for applying voltage, and a thickness of the acrylic adhesive layer between the insulator and the electrostatic chuck section is set to be in a range of 50 μm or more and 150 μm or less.

5. The electrostatic chuck device according to any one of claims 1 and 2-4, wherein an insulating material layer is provided on a principal surface on the electrostatic chuck section side of the cooling plate section with a second adhesive material layer interposed therebetween, and the insulating material layer is bonded to and integrated with the electrostatic chuck section and the heating member through the acrylic adhesive layer.

* * * * *